US008816720B2

(12) United States Patent
Kim et al.

(10) Patent No.: US 8,816,720 B2
(45) Date of Patent: Aug. 26, 2014

(54) SINGLE POWER SUPPLY LOGIC LEVEL SHIFTER CIRCUIT

(75) Inventors: Hoki Kim, Sunnyvale, CA (US); Changku Hwang, Sunnyvale, CA (US); Jinuk Shin, Sunnyvale, CA (US)

(73) Assignee: Oracle International Corporation, Redwood City, CA (US)

( * ) Notice: Subject to any disclaimer, the term of this patent is extended or adjusted under 35 U.S.C. 154(b) by 190 days.

(21) Appl. No.: 13/449,018

(22) Filed: Apr. 17, 2012

(65) Prior Publication Data

US 2013/0271181 A1    Oct. 17, 2013

(51) Int. Cl.
*H03K 19/0175*    (2006.01)

(52) U.S. Cl.
USPC ............... 326/81; 326/63; 326/68; 327/333

(58) Field of Classification Search
USPC ............... 326/3, 68, 80–81, 63; 327/333
See application file for complete search history.

(56) References Cited

U.S. PATENT DOCUMENTS

| 5,378,943 | A  | * | 1/1995  | Dennard | 326/68 |
| 6,043,699 | A  | * | 3/2000  | Shimizu | 327/333 |
| 6,861,873 | B2 | * | 3/2005  | Correale, Jr. | 326/81 |
| 7,112,996 | B2 | * | 9/2006  | Lee | 326/68 |
| 7,463,065 | B1 | * | 12/2008 | Lin et al. | 326/68 |
| 7,583,126 | B2 | * | 9/2009  | Yang et al. | 327/333 |
| 7,750,717 | B2 | * | 7/2010  | Ali et al. | 327/333 |
| 7,759,976 | B2 | * | 7/2010  | Ogawa | 326/63 |
| 7,830,175 | B1 | * | 11/2010 | Lin et al. | 326/68 |
| 7,843,220 | B2 | * | 11/2010 | Kolinummi et al. | 326/62 |
| 8,339,177 | B2 | * | 12/2012 | Jarrar et al. | 327/333 |
| 2007/0290735 | A1 | * | 12/2007 | Ali et al. | 327/333 |

* cited by examiner

*Primary Examiner* — Jason M Crawford
(74) *Attorney, Agent, or Firm* — Martine Penilla Group, LLP

(57)    ABSTRACT

A system and method of shifting a data signal from a first voltage domain having a first logic level to a second voltage domain having a second logic level, the second logic level having a second logical high state greater than a first logical high state in the first logic level and a single power supply logic level shifter circuit having a single power supply source, an input node and an output node, the input node coupled to a sender circuit in the first voltage domain and the output node coupled to a receiver circuit in the second voltage domain, the single power supply source being coupled only to a single power grid in the second voltage domain.

13 Claims, 6 Drawing Sheets

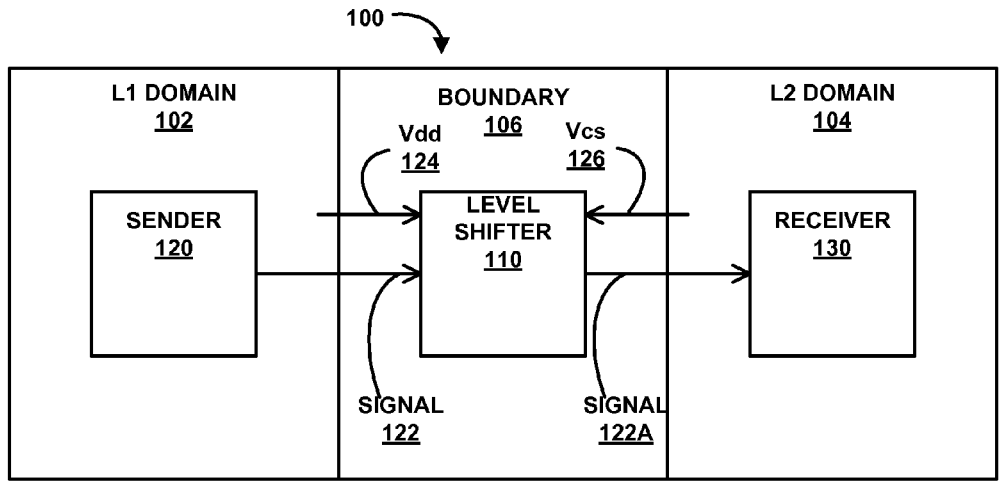
**FIG. 1
PRIOR ART**
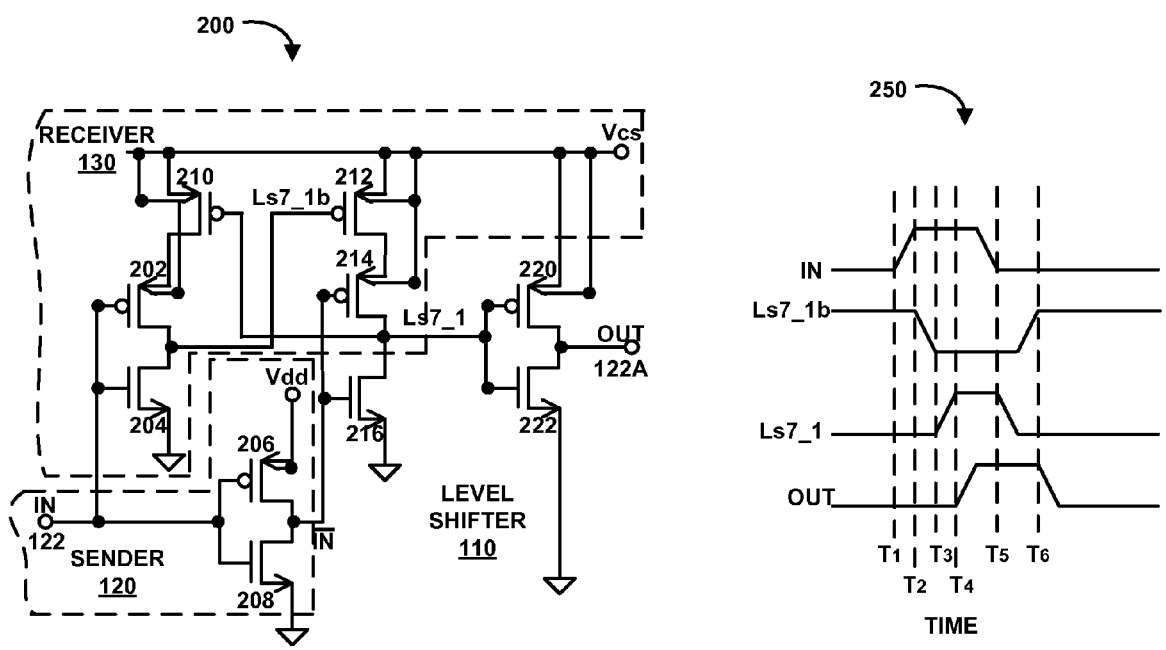
**FIG. 2A
PRIOR ART**
**FIG. 2B
PRIOR ART**

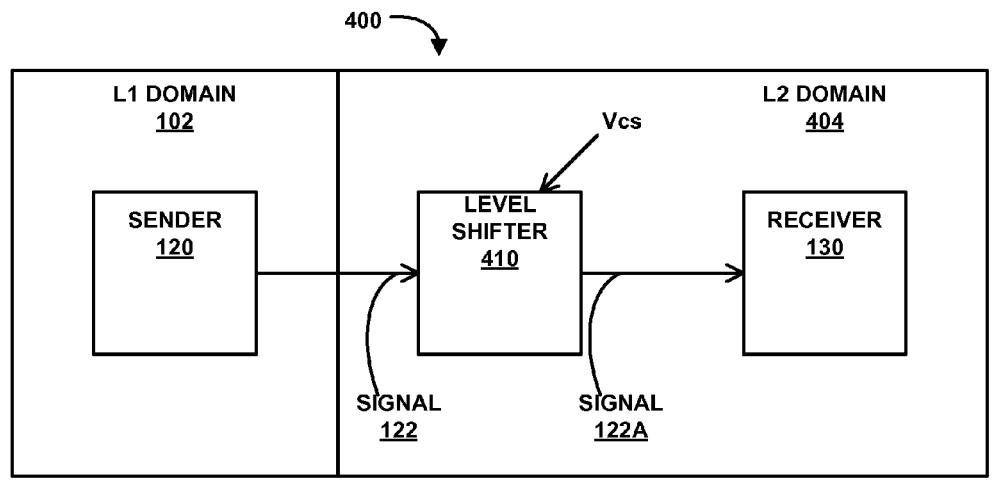
FIG. 4
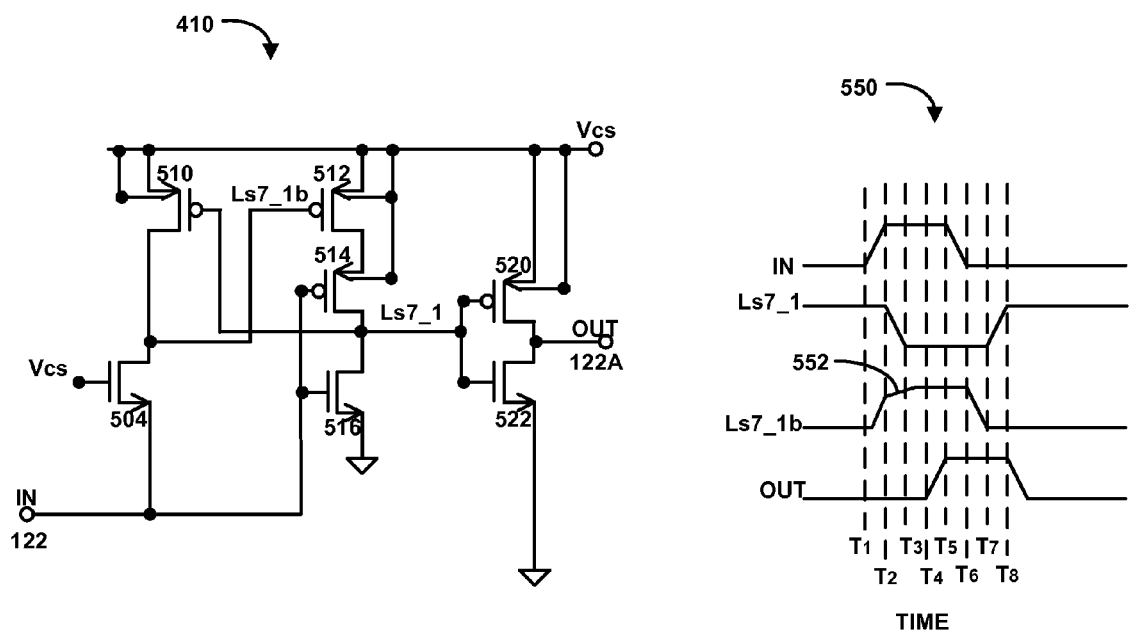
FIG. 5A
FIG. 5B

SINGLE POWER SUPPLY LOGIC LEVEL SHIFTER CIRCUIT

BACKGROUND

The present invention relates generally to microprocessor architecture, and more particularly, to methods and systems for transferring data across different logical voltage domains.

Microprocessors and computers are made from lots of different semiconductor materials. Each type of semiconductor material has a respective voltage level for its logic. For example in some semiconductor or devices a logical one or high state is 5 volts DC. This could be positive or negative 5 volts DC. In a second semiconductor circuit or device using another type of semiconductor technology or structure a logical one or high state could be only 1 volt DC. In yet a third semiconductor circuit or device, using a third type of semiconductor technology or structure, a logical one or high state can be represented by only 0.6 volts DC. In yet a fourth semiconductor circuit or device, using a fourth type of semiconductor technology or structure, a logical one or high state can be represented by only 0.3 volts DC or less.

As a result of these different logical levels used in different types of semiconductor circuits or devices, when transferring a logical one value or high state from, for example the fourth semiconductor circuit (e.g., logical one or high state is represented as 0.3 volts DC) to the first semiconductor circuit (e.g., logical one or high state is represented as 5.0 volts DC), the logical one or high state value must be stepped up or amplified (i.e., shifted) as the logical one or high state value is output from the fourth semiconductor circuit and before being input to the first semiconductor circuit.

Similarly, when outputting a logical one value or high state value from the first semi conductor circuit to the fourth semiconductor circuit, the logical one value must be shifted down to the respective logic levels for the fourth semiconductor circuit.

Typically, this shifting up or down of the logic value occurs in a logic level shifting circuit that is on the same chip as the first semiconductor circuit and the fourth semiconductor circuit. The logic level shifting circuit is typically located between the first semiconductor circuit and the fourth semiconductor circuit. The logic level shifting circuit is in the data path of transferring data from the first semiconductor circuit to the fourth semiconductor circuit and as a result distance and spacing and circuit performance is very important to reduce the time lag or clock cycle count of transferring data from the first semiconductor circuit to the fourth semiconductor circuit. As a result the logic level shifting circuit consumes much valuable area on a chip because it is located between the two semiconductor circuits and not off to one side.

A typical logic level shifting circuit includes two voltage inputs. One input from each of the first and fourth semiconductor circuits. So that the logic level can be stepped up or step down to the respective logic levels corresponding to the semiconductor circuits. However, having two voltage inputs makes the typical logic level shifting circuit more complex than required and therefore consumes more area on the chip. In view of the foregoing, there is a need for a simpler, smaller and faster logic level shifting circuit.

SUMMARY

Broadly speaking, the present invention fills these needs by providing a system, method and apparatus having a single power supply logic level shifter circuit. It should be appreciated that the present invention can be implemented in numerous ways, including as a process, an apparatus, a system, computer readable media, or a device. Several inventive embodiments of the present invention are described below.

One embodiment provides an integrated circuit including a first voltage domain having a first logical high state, a second voltage domain having a second logical high state, the second logical high state being greater than the first logical high state and a single power supply logic level shifter circuit. The single power supply logic level shifter circuit including a single power supply source, an input node and an output node, the input node coupled to a sender circuit in the first voltage domain and the output node coupled to a receiver circuit in the second voltage domain, the single power supply source being coupled only to a single power grid in the second voltage domain.

The single power supply logic level shifter circuit can be included within the second voltage domain. The single power supply logic level shifter circuit can be included a boundary domain disposed between the first voltage domain and the second voltage domain. The single power supply logic level shifter circuit can be disposed external from both and adjacent to at least one of the first voltage domain and the second voltage domain.

The single power supply logic level shifter circuit can includes a charge and break circuit. The charge and break circuit can be coupled between the single power source and an intermediate node. The charge and break circuit can include a three gate delay circuit having an input coupled to the output node and an output coupled to a pull-up transistor, the pull-up transistor output coupled to the intermediate node.

The single power supply logic level shifter circuit can also include a bleeder circuit. The bleeder circuit can be coupled between the single power source and an intermediate node. The bleeder circuit couples a leakage current to the intermediate node. The single power supply logic level shifter circuit can include a charge and break circuit and a bleeder circuit.

Another embodiment provides a method of shifting logic levels from a first voltage to a second voltage includes the first voltage domain having a first logical high state, the second voltage domain having a second logical high state, the second logical high state being greater than the logical high state. An input signal is shifted from low to high on an input node in a single power supply logic level shifter circuit. The method can also include discharging an output node of the single power supply logic level shifter circuit to a low state, wherein the single power supply logic level shifter circuit is coupled to a single power supply source, the input node coupled to a sender circuit in the first voltage domain and the output node coupled to a receiver circuit in the second voltage domain, the single power supply source being coupled to a power grid in the second voltage domain.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 1 is a typical integrated circuit.

FIG. 2A is a schematic diagram of a typical logic level shifter circuit.

FIG. 2B is a logic timing graph of the typical logic level shifter circuit.

FIG. 4 is an integrated circuit with a single power supply logic level shifter circuit, in accordance with an embodiment of the present invention.

FIG. 5A is a schematic diagram of the single power supply logic level shifter circuit, in accordance with an embodiment of the present invention.

FIG. 5B is a logic timing graph of the single power supply logic level shifter circuit, in accordance with an embodiment of the present invention.

DETAILED DESCRIPTION

Figure 3:
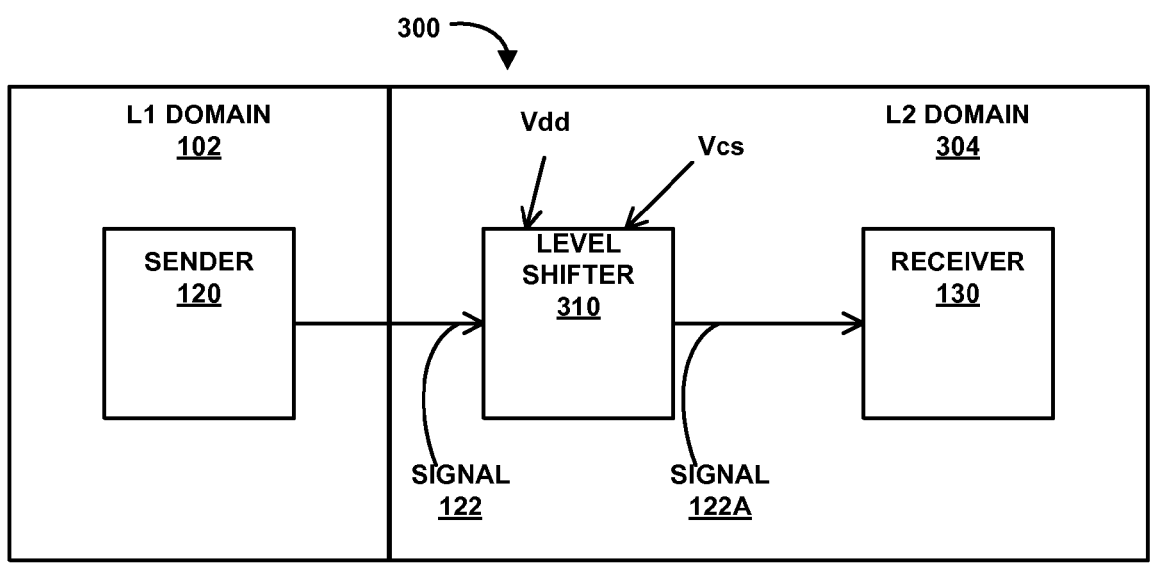
FIG. 3 is another typical integrated circuit with a logic level shifter circuit.

Several exemplary embodiments for systems, methods and apparatus having a single power supply logic level shifter circuit will now be described. It will be apparent to those skilled in the art that the present invention may be practiced without some or all of the specific details set forth herein.

A single power supply logic level shifter circuit needs only one power supply and provides a faster operation comparable to a buffer delay. The single power supply logic level shifter circuit is easier to integrate, simplifies power grid design and is more flexible in signal routing in modern SOC (System On chip) and microprocessor designs that include multiple power supply domains. The single power supply logic level shifter circuit enables a higher performance microprocessor design and accelerates and simplifies the design process.

FIG. 1 is a typical integrated circuit 100. The typical integrated circuit 100 includes at least two voltage level domains 102, 104. A logic level shifter circuit 110 is located in a boundary area 106 located between the two voltage level domains 102, 104. As described above, the logic level shifter circuit 110 shifts a logic signal 122 from a sender 120 in the first voltage level domain (L1 domain) 102 to a shifted logic signal 122A. The shifted logic signal 122A is received by a receiver 130 in the second voltage level domain (L2 domain) 104. The shifted logic signal 122A is shifted up or down in voltage as needed to provide an accurate data exchange from the sender 120 to the receiver 130.

FIG. 2A is a schematic diagram of a typical logic level shifter circuit 200. FIG. 2B is a logic timing graph of the typical logic level shifter circuit 200. The typical logic level shifter circuit 200 includes components in each of the domains 102, 104 and in the boundary 106. Transistors 206 and 208 are part of the sender 120 in L1 domain 102. The sender 120 also provides power at the level of Vdd to transistor 206. Transistors 202, 204, 210, 212 and 214 are part of the receiver 130 in L2 domain 104. The receiver 130 also provides power at the level of Vcs to transistors 210, 212 and 220. Transistors 216, 220 and 222 are part of the logic level shifter circuit 110 in the boundary 106. It should be understood that the term transistor as used herein can include all types of field effect transistors (FETs), gate type transistors and any other suitable semiconductor device.

Input signal 122 from the sender 120 in a lower voltage L1 domain 102 is shifted into a corresponding high voltage output signal 122A suitable for the logic circuits in the receiver 130 in a higher voltage L2 domain 104. The shifting portion of the circuit 200 operates on the higher power supply voltage Vcs and requires two complementary inputs (IN and not IN). The two complementary inputs IN and not IN operate on sender circuit's 120 lower voltage power supply Vdd. Therefore, the logic level shifter circuit always requires two power supplies, Vcs and Vdd. The signal traffic between and among the differently voltage domains is very complex in system on a chip and microprocessor designs having multiple levels of supply powered modules or IPs that are integrated on the same integrated circuit. Every signal crossing from one voltage domain to another voltage domain requires a logic level shifter circuit. The two power supply requirement restricts the suitable locations for the logic level shifter circuit 110 on the integrated circuit to the boundary 106 between two voltage domains 102, 104.

FIG. 3 is another typical integrated circuit 300 with a logic level shifter circuit 310. The logic level shifter circuit 310 is moved entirely into one of the voltage domains 102, 304, specifically L2 domain 304, in this instance. This configuration then requires two different power grids Vdd and Vcs included in the L2 domain 304 to support the logic level shifter circuit 310. The dependence on two power grids Vdd and Vcs limits the placement of the logic level shifter circuit while also complicating the power grid design.

FIG. 4 is an integrated circuit 400 with a single power supply logic level shifter circuit 410, in accordance with an embodiment of the present invention. FIG. 5A is a schematic diagram of the single power supply logic level shifter circuit 410, in accordance with an embodiment of the present invention. FIG. 5B is a logic timing graph 550 of the single power supply logic level shifter circuit 410, in accordance with an embodiment of the present invention.

The single power supply logic level shifter circuit 410 features fast level shifting time and high portability in physical circuit design integration. The shifting part of the single power supply logic level shifter circuit 410 uses one input signal (IN 122) and does not require being coupled to the sender's 120 power supply (Vdd). The shifting part of the single power supply logic level shifter circuit 410 only uses the receiver's power supply (Vcs).

In sharp contrast to the typical logic level shifter circuit 200, the input signal 122 from sender 120 is input to an input node on a source of transistor 504 and a gate of transistor 516 only and does not use the sender's 120 power supply Vdd. The gate of receiver transistor 504 is connected only to high voltage power supply (Vcs) from the receiver 130.

Figure 8:
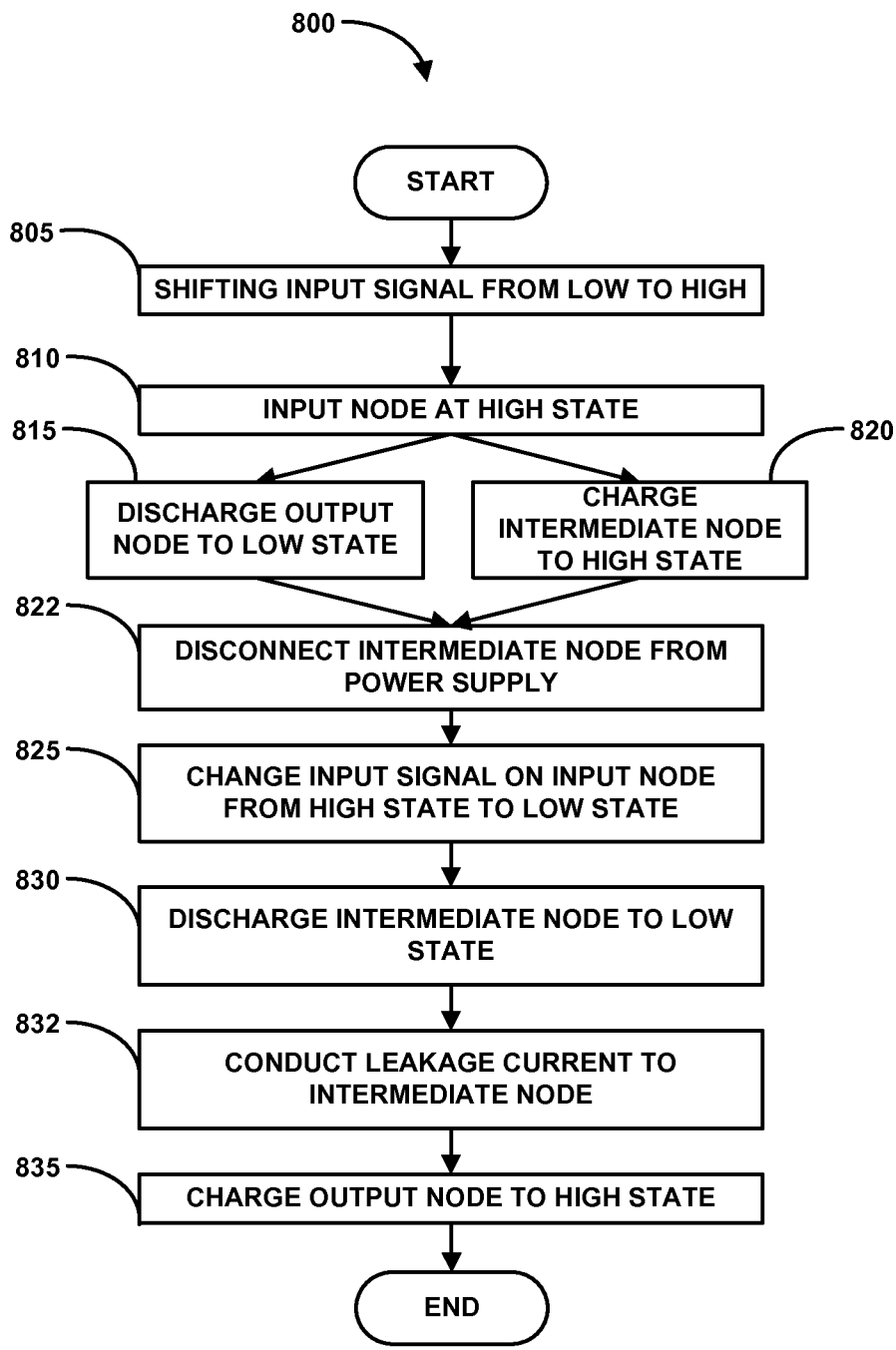
FIG. 8 is a flowchart of the method operation for shifting logic level in a single power supply logic level shifter circuit, in accordance with an embodiment of the present invention.

FIG. 8 is a flowchart of the method operation 800 for shifting logic level in a single power supply logic level shifter circuit, in accordance with an embodiment of the present invention. The operations illustrated herein are by way of example, as it should be understood that some operations may have sub-operations and in other instances, certain operations described herein may not be included in the illustrated operations. With this in mind, the method and operations 800 will now be described.

Referring to FIGS. 5A-B and 8, in an operation 805, at time T1, input signal IN on the input node 122 begins changing from low to high. The input signal IN on the input node 122 attains the high state at time T2, in an operation 810. With the input signal 122 at the high state transistor 516 is conducting which couples output node Ls7_1 to ground and as a result output node Ls7_1 discharges to low state at time T3 in an operation 815. Also simultaneously when transistor 516 is conducting, intermediate node ls7_1b is gradually charged to high state (Vcs) at between time T3 and T4 in an operation 820.

During the time input signal 122 changing from high to low, the input signal and pull up path through transistor 514 on pull up node ls7_1b are fighting until output node ls7_1 is fully charged and shuts off transistor 514. This fighting leads to slower shift time as shown by gradual shift 552 in the voltage at node ls7_1b. This fighting also unnecessarily consumes power.

In an operation 825, input signal 122 changes from high state to low state at time T6, transistor 504 begins to conduct and couples intermediate node ls7_1b to ground, thus discharging intermediate node ls7_1b to a low state at time T7, in an operation 830. In an operation 835, input signal 122 is low at time T7, transistor 516 stops conducting and transistor 514 begins to conduct which charges output node ls7_1 to a high state.

Figure 6A:
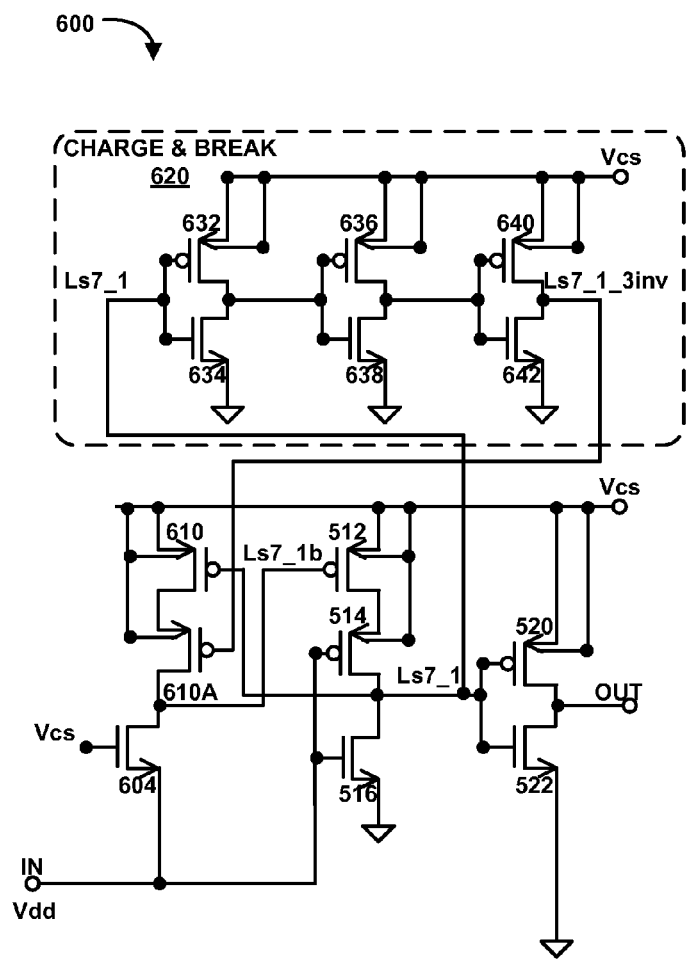
FIG. 6A is a schematic diagram of the single power supply logic level shifter circuit with a charge and break circuit, in accordance with an embodiment of the present invention.
Figure 6B:
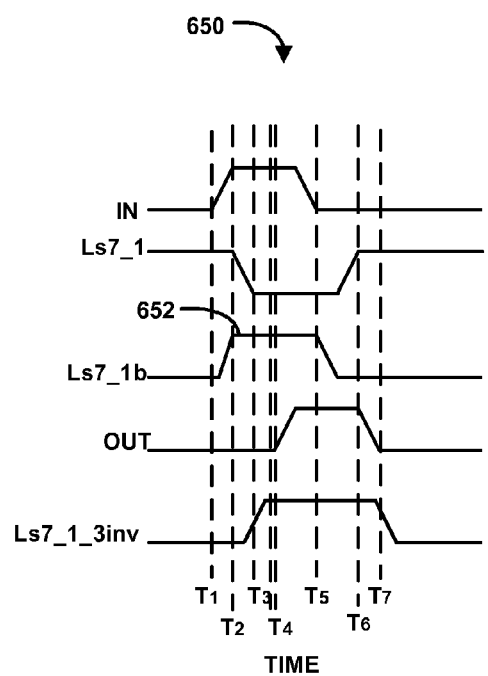
FIG. 6B is a logic timing graph of the single power supply logic level shifter circuit with a charge and break circuit, in accordance with an embodiment of the present invention.

FIG. 6A is a schematic diagram 600 of the single power supply logic level shifter circuit 410 with a charge and break circuit 620, in accordance with an embodiment of the present invention. FIG. 6B is a logic timing graph 650 of the single power supply logic level shifter circuit 410 with a charge and break circuit 620, in accordance with an embodiment of the present invention. A charge and break circuit 620 is tapped to transistor 610A and controls the current path from the power supply (Vcs) to pull up intermediate node ls7_1b and thus improves the high to low shift time as shown by shift 652 in the voltage at intermediate node ls7_1b, in FIG. 6B, as compared to the shift 552 shown in FIG. 5B.

After the input signal 122 changes from low to high and inverting node ls7_1 is discharged, ls7_1b is charged through pull up circuit for 3 gate delays and disconnected from power source (Vcs) as described above in operations 810-820 and 825. When input signal 122 changes from high to low, input signal discharges intermediate node ls7_1b without current fighting from pull up part because the current path from the supply Vcs through pull-up transistors 610 and 610A is disconnected by the charge and break circuit 620 in an operation 822. The charge and break circuit 620 includes three transistor pairs 632 and 634, 636 and 638, 640 and 642 coupled in series. The three transistor pairs 632-642 provide a three gate delay circuit. The three transistor pairs 632-642 have an input coupled to the output node Ls7_1 and an output coupled to a pull-up transistor 610A. As a result, the charge and break circuit 620 enables pull-up transistor 610A 3 gate delays after output node Ls7_1 goes to a low state. The charge and break circuit 620 disables pull-up transistor 610A 3 gate delays after output node Ls7_1 goes to a high state.

Figure 7:
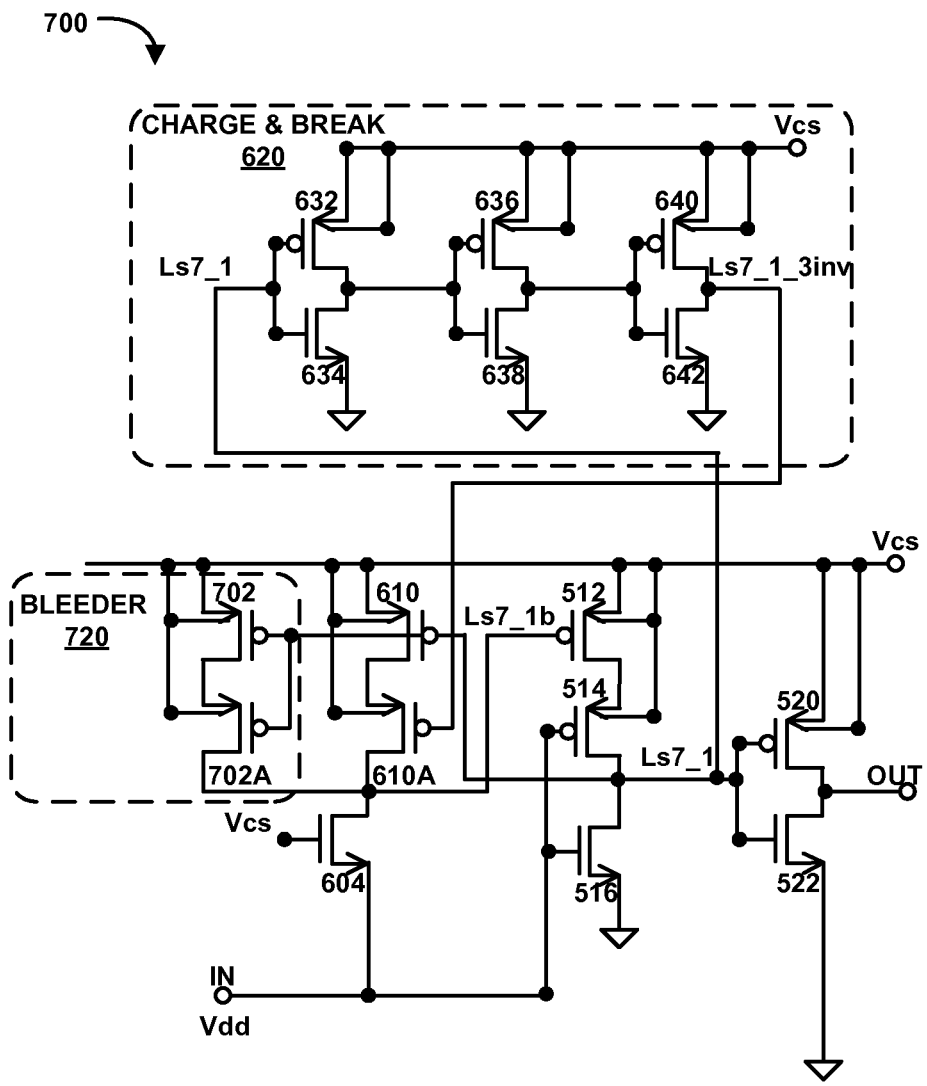
FIG. 7 is a schematic diagram of the single power supply logic level shifter circuit with a charge and break circuit and a bleeder circuit, in accordance with an embodiment of the present invention.

FIG. 7 is a schematic diagram 700 of the single power supply logic level shifter circuit 410 with a charge and break circuit 620 and a bleeder circuit 720, in accordance with an embodiment of the present invention. Intermediate node ls7_1b is disconnected from power supply (Vcs) by the charge and break circuit 620 after being charged up to a high state as described above in FIG. 6A. Disconnecting intermediate node ls7_1b from power supply (Vcs) places the node ls7_1b is in a floating state until the next time the input signal changes to low.

The bleeder circuit 720 is added and prevents the intermediate node ls7_1b from floating. The bleeder circuit 720 compensates the leakage current from intermediate node ls7_1b to maintain a charged state on intermediate node ls7_1b. When the input signal 122 goes low, the bleeder transistors 702, 702A conduct and provide a leakage current to intermediate node ls7_1b in an operation 832.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit comprising:
a first voltage domain having a first logical high state;
a second voltage domain having a second logical high state, the second logical high state being greater than the first logical high state; and
a single power supply logic level shifter circuit having:
a single power supply source;
an input node;
an output node, the input node coupled to a sender circuit in the first voltage domain and the output node coupled to a receiver circuit in the second voltage domain, the single power supply source being coupled only to a single power grid in the second voltage domain; and
a charge and break circuit including a three gate delay circuit having an input coupled to the output node and an output coupled to a pull-up transistor, the pull-up transistor output coupled to an intermediate node.

2. The integrated circuit of claim 1, wherein the single power supply logic level shifter circuit is included with the second voltage domain.

3. The integrated circuit of claim 1, wherein the single power supply logic level shifter circuit is included a boundary domain disposed between the first voltage domain and the second voltage domain.

4. The integrated circuit of claim 1, wherein the single power supply logic level shifter circuit is disposed external from both of the first voltage domain and the second voltage domain and wherein the single power supply logic level shifter circuit is disposed adjacent to one of the first voltage domain and the second voltage domain.

5. The integrated circuit of claim 1, wherein the single power supply logic level shifter circuit includes a bleeder circuit.

6. The integrated circuit of claim 5, wherein the bleeder circuit is coupled between the single power source and the intermediate node.

7. The integrated circuit of claim 6, wherein the bleeder circuit couples a leakage current to the intermediate node.

8. The integrated circuit of claim 1, wherein the intermediate node is capable of being disconnected the from the single power supply source.

9. A method of shifting logic levels from a first voltage to a second voltage comprising:
the first voltage domain having a first logical high state, the second voltage domain having a second logical high state, the second logical high state being greater than the first logical high state;
shifting an input signal from low to high on an input node in a single power supply logic level shifter circuit;
discharging an output node of the single power supply logic level shifter circuit to a low state, wherein the single power supply logic level shifter circuit is coupled to a single power supply source, the input node coupled to a sender circuit in the first voltage domain and the output node coupled to a receiver circuit in the second voltage domain, the single power supply source being coupled to a power grid in the second voltage domain, the single power supply including a charge and break circuit including a three gate delay circuit having an input coupled to the output node and an output coupled to a pull-up transistor, the pull-up transistor output coupled to an intermediate node.

10. The method of claim 9, wherein the single power supply logic level shifter circuit includes a bleeder circuit.

11. The method of claim 10, wherein the bleeder circuit is coupled between the single power source and the intermediate node.

12. The method of claim 11, wherein the bleeder circuit couples a leakage current to the intermediate node.

13. The method of claim 9, wherein the intermediate node is charged to a high state for 3 gate delays and then placed in a floating state.

* * * * *

UNITED STATES PATENT AND TRADEMARK OFFICE
CERTIFICATE OF CORRECTION

| | | |
|---|---|---|
| PATENT NO. | : 8,816,720 B2 | Page 1 of 1 |
| APPLICATION NO. | : 13/449018 | |
| DATED | : August 26, 2014 | |
| INVENTOR(S) | : Kim et al. | |

It is certified that error appears in the above-identified patent and that said Letters Patent is hereby corrected as shown below:

In the Specification

In column 1, line 34, delete "semi conductor" and insert -- semiconductor --, therefor.

In the Claims

In column 6, line 52, in Claim 8, after "disconnected" delete "the".

Signed and Sealed this
Tenth Day of March, 2015

Michelle K. Lee
*Deputy Director of the United States Patent and Trademark Office*